United States Patent
Gabillard et al.

(10) Patent No.: US 7,180,354 B2
(45) Date of Patent: Feb. 20, 2007

(54) RECEIVER HAVING FULL SIGNAL PATH DIFFERENTIAL OFFSET CANCELLATION CAPABILITIES

(75) Inventors: Bertrand Gabillard, Paris (FR); Philippe Hauviller, Itteville (FR); Alexandre Maltere, Montgeron (FR); Christopher Ro, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 10/906,988

(22) Filed: Mar. 15, 2005

(65) Prior Publication Data

US 2005/0212564 A1    Sep. 29, 2005

(30) Foreign Application Priority Data

Mar. 25, 2004    (EP)    .................................. 04368019

(51) Int. Cl.
*H03L 5/00* (2006.01)
(52) U.S. Cl. ...................................... 327/307; 327/319
(58) Field of Classification Search ................ 327/307, 327/317–319, 323; 330/9, 252
See application file for complete search history.

(56) References Cited

U.S. PATENT DOCUMENTS

| | | | | |
|---|---|---|---|---|
| 6,437,608 B1 * | 8/2002 | Miyabe et al. | ................ | 327/96 |
| 6,724,248 B2 * | 4/2004 | Llewellyn | ........................ | 330/9 |
| 6,914,479 B1 * | 7/2005 | Gabillard et al. | ............. | 330/69 |
| 6,933,762 B2 * | 8/2005 | Ono | ........................... | 327/307 |
| 6,946,986 B2 * | 9/2005 | Gabillard et al. | ........... | 341/150 |

* cited by examiner

*Primary Examiner*—Timothy P. Callahan
*Assistant Examiner*—Hai L. Nguyen
(74) *Attorney, Agent, or Firm*—Lisa U. Jaklitsch

(57) ABSTRACT

There is described an improved receiver which first comprises an analog input amplifier a sample and hold differential circuit and two stages of differential comparators that are connected in series, wherein the first stage consists of two comparators and the second stage of one comparator. By properly activating the switches with signals generated by a dedicated control logic, the input differential signal is sampled in the sample and hold circuit to generate first and second differential signals. The first differential signal holds a first state and the second differential signal propagates the second state. As result, the signal output by the second comparator stage reflects the differential offset minus the offset compensation.

8 Claims, 5 Drawing Sheets

RECEIVER HAVING FULL SIGNAL PATH DIFFERENTIAL OFFSET CANCELLATION CAPABILITIES

FIELD OF THE INVENTION

The present invention relates to high speed serial communications/data transfers between integrated circuits or systems and more particularly to an improved receiver provided with an innovative serial link offset cancellation circuit that compensates the full signal path to eliminate the totality of the differential offset from the driver to the receiver whatever data are encoded or not. The present invention also encompasses a method for compensating the full signal path differential offset between the driver and the receiver, including the one caused by the transporting media and the adaptation, whatever data are encoded or not.

BACKGROUND OF THE INVENTION

With the increasing frequency of signals used in modern communication links, unwanted effects such as cross talk, ringing, reflection, ISI, offset, clock jitter and the like, occur due to the distributed nature of the media which transports these signals. A major contributor in DC coupled lines is the differential input signal DC offset (differential offset in short) which is the combination result of different amplitudes and common modes on each line of the differential pair. The circuits that are used in the signal path, such as the drivers and receivers, the transporting media (e.g. transmission lines, . . . ) and the adaptation circuits therebetween, are the main causes to said differential offset.

A definition of the differential offset will be now given in conjunction with FIGS. 1A and 1B. FIG. 1A shows a differential signal $V_P$ and $V_M$, respectively the potential applied on the positive and the negative legs or input terminals of a receiver, their difference ($V_P-V_M$) representing the data. As apparent in FIG. 1A, amplitudes and common modes are different into the assert phase (A) and negate or de-assert phase (N). These amplitudes are respectively labeled $V_{PA}/V_{MA}$ and $V_{MN}/V_{PN}$, and will be referred to hereafter as the asserted data (state=1) and de-asserted data (state=0). The two common modes are shown in dotted lines. The differential offset $V_{off}$ is equal to the half sum of the differential amplitude ($V_{PA}-V_{MA}$) in the assert phase and of the differential amplitude ($V_{PN}-V_{MN}$) in the negate phase and thus can be written in either one of the two relations $V_{off}=((V_{PA}+V_{PN})-(V_{MA}+V_{MN}))/2$ or $V_{off}=((V_{PA}-V_{MA})+(V_{Pn}-V_{MN}))2$. The differential offset is represented in FIG. 1B.

As the signal frequency increases and/or the distance to communicate, and due to the limited bandwidth of the transporting media (or cost limitation), the signal amplitude and slew rate is much reduced so that the signal degradation, due to the differential offset, becomes prohibitive. The differential offset impact on the signal distortion is usually referred to as the timing asymmetry (abbreviated in Tasym). FIGS. 2A and 2B show a differential signal carrying a significant offset and its impact on the receiver logic output signal for a fast and slow transporting media respectively. A fast media (FIG. 2A) causes a high slew rate (Tasym=$V_{off}$/slew rate) while a slow media (FIG. 2B) causes a high attenuation (Tasym=$(T/2)\times Sin^{-1}(V_{off}/V_{amp})$, wherein $V_{amp}$ is the amplitude of the signal, assuming it is perfectly sine-shaped. The timing asymmetry is responsible for closing the signal eye at the receiver output. The eye diagram is an important characteristic of high speed serial data links.

Data jitter and/or phase error (skew) can significantly reduce the useful sampling window. This basically reduces the following sampling circuit tolerance to the jitter and could increase the bit error rate (BER). The generated timing asymmetry is proportional to the ratio of offset versus the input slew rate. For instance, pursuant to the SCSI standard for hard-disk applications, referred to as SCSI-pi5, the timing asymmetry is up to 900 ps (on both sides of the signal eye) to be compared to the 3.125 ns bit cell, this is closing the signal eye by about 57%. According to this standard, data are transported at 320 MHz, a 12 meter transporting media is used and a 16 device connection is supported. In such application, the differential offset on its own could close up to 50% of the signal eye, so that a compensation of the differential offset becomes mandatory. Other applications such as high speed point to point back plane communications will suffer from the same problem, the differential offset becomes prohibitive due to the media attenuation at speed above the GHz.

On the other hand, the jitter and ISI have also a detrimental effect on the closure of the signal eye. The effect of the jitter is to decrease the width of the time interval in which the data signal can be reliably sampled. The effect of the ISI is to add a delay on the data stream depending on the past values of the data. For high speed data transfers, this ISI can substantially decrease the capacity of the receivers to tolerate the random data jitter.

FIG. 3 shows a conventional receiver of the prior art referenced 10 connected as an interface between a bus 11 and a logic deskewer block 12. The deskewer block 12 is in charge of capturing the data at the best sampling point, then resynchronizing all bits together to rebuilt the original word. Now turning to FIG. 3, the conventional receiver 10 consists of an adaptator 13, an equalizer 14 and a comparator 15 that are connected in series. The comparator 15 is controlled by a digital to analog converter (DAC) 16. Adaptator 13 and equalizer 14 which form analog input amplifier 17 respectively perform level shifting attenuation and high frequency boosting. Such a receiver 10 is usually associated with a successive approximation register (SAR) 18 which is connected at the comparator 15 output. The role of the SAR 18 is to determine the offset compensation value and to hold it in dedicated registers. The combination of a DAC, a SAR and a comparator shown in FIG. 3 is known but only for the purpose of compensating the receiver offset by short circuiting its inputs. This compensation value labeled OS, which is determined and stored in the SAR 18, is applied to the DAC 16. In turn, DAC 16 generates a control signal named Cor_ofs which is applied to the comparator 15. In receiver 10, comparator 15 is a simple differential amplifier able to make the difference between the two components of the differential signal. For standard applications, i.e. other than SCSI-pi5, adaptor 13 and equalizer 14 are optional circuit blocks. The front end adaptor 13 can be very simple and the equalizer 14 may even be not used. There are known techniques to eliminate the differential offset in encoded data transmission techniques such as SONET or 8-to-10 encoding data, but not for non-encoded data like SCSI, that do not settle maximum run length (the signal bandwidth has no frequency limitations). Canceling only the receiver differential offset is easy to implement but it solves only 30% of its magnitude.

The conventional receiver 10 depicted in FIG. 3 will not be compliant with the SCSI-pi5 (T10) standard because it requests a very significant offset compensation capability (20 mV residual differential offset and Tasym lower than 200 ps). For instance, to date, conventional receivers exhibit Tasym values up to 900 ps that are to be compared to the 3.125 ns bit cell, so that the signal eye is closed by about 57%. Keeping in mind that the specification related to ISI (intersymbol interference) is very aggressive, such receivers could not be operative with this standard.

SUMMARY OF THE INVENTION

It is therefore a primary object of the present invention to provide an improved receiver having full signal path differential offset compensation capabilities that totally eliminates the differential offset a driver and a receiver.

It is another object of the present invention to provide an improved receiver having full signal path differential offset compensation capabilities whatever data are encoded or not.

It is another object of the present invention to provide an improved receiver having full signal path differential offset compensation capabilities that cancels more than 90% of the differential offset magnitude at the receiver level.

It is another object of the present invention to provide an improved receiver having full signal path differential offset compensation capabilities that is fully compliant with the SCSI-pi5 standard.

It is still another further object of the present invention to provide a method for compensating the differential offset on the full signal path between the driver and the receiver whatever encoded or non-encoded data transmission. According to the present invention there is described an improved receiver which first comprises an analog input amplifier, a sample and hold circuit, and two stages of differential comparators that are connected in series, wherein the first stage consists of two comparators and the second stage of one comparator. Each comparator is able to process a differential signal. It further comprises a DAC that is connected to the comparators of the first stage. The improved receiver generates the full CMOS output swing at its output that is applied to a successive approximation register (SAR). The compensation value is determined by the SAR and stored therein as binary digits in dedicated latches. The binary compensation value is applied to the DAC. The first and second stages of comparators function as a single "global" comparator. By properly activating the switches with signals generated by a dedicated control logic, the asserted input signal (first state) is memorized in said holding capacitors while the negate signal (second state) is propagated, so that the signal output by the global comparator, reflects the differential offset minus the offset compensation. By adjusting the offset compensation (through the SAR/DAC/global comparator combination), the second stage comparator will flip to the other state whenever the compensation value crosses the differential offset value for offset compensation.

The improved receiver is totally adapted to meet SCSI-pi5 specification.

According to the present invention there also is described a method for compensating the full signal path differential offset between a driver and a receiver for encoded or non-encoded data such as in the SCSI-pi5 standard. According to the SCSI-pi5 standard, a low frequency training (or test) pattern is transmitted during a preliminary step, before the data are sent. The method comprises the steps of:

sampling the input differential signal in a sample and hold differential circuit made of switches and two holding capacitors to generate first and second differential signals, so that the first differential signal holds a first state and the second differential signal propagates the second state;

applying said first and second differential signals to first and second comparators to compute the difference between these states;

applying the signals that are output by said first and second comparators to the positive and negative inputs of a third comparator to make the difference therebetween and generates an output voltage that reflects the differential offset minus the compensation offset;

determining the binary value of said compensation offset by successive iterations in a successive approximation register, digitizing said compensation value and storing it therein;

applying said binary compensation value in a DAC to generate a first offset compensation signal and its complemented value; and, applying said offset compensation signal and its complement value to said first and second comparators for offset compensation.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

BRIEF DESCRIPTION OF THE DRAWINGS

FIG. 1A shows a differential signal $V_P$ and $V_M$, applied to the input terminals of a receiver, their difference ($V_P$-$V_M$) representing the data. FIG. 1B shows the differential offset.

DESCRIPTION OF A PREFERRED EMBODIMENT

Figure 1A:
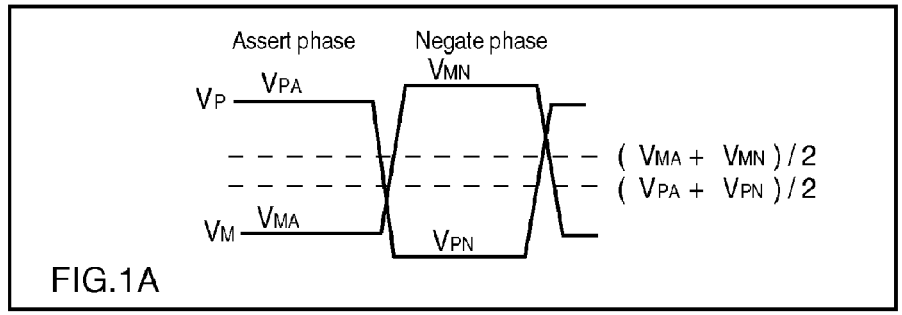
FIGS. 1A and 1B illustrate the differential input signal DC offset definition.
Figure 1B:
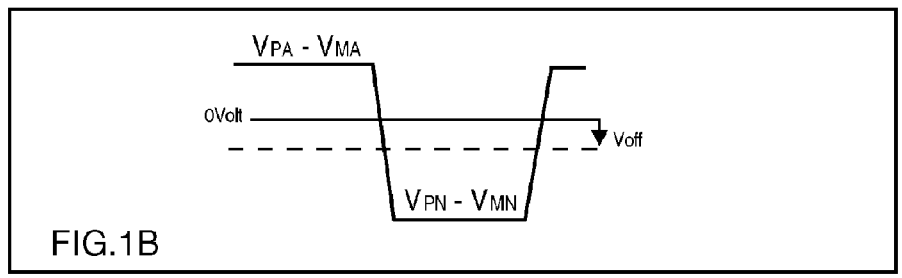
Figure 2A:
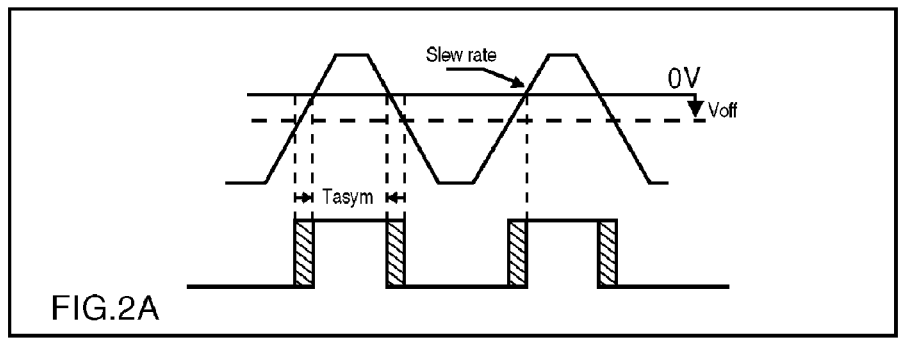
FIGS. 2A and 2B illustrate the timing asymmetry due to the differential offset for a fast and a low transporting media respectively.
Figure 2B:
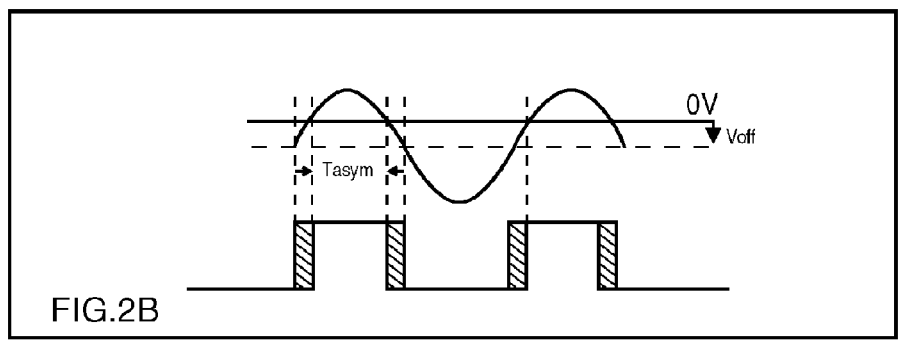
Figure 3:
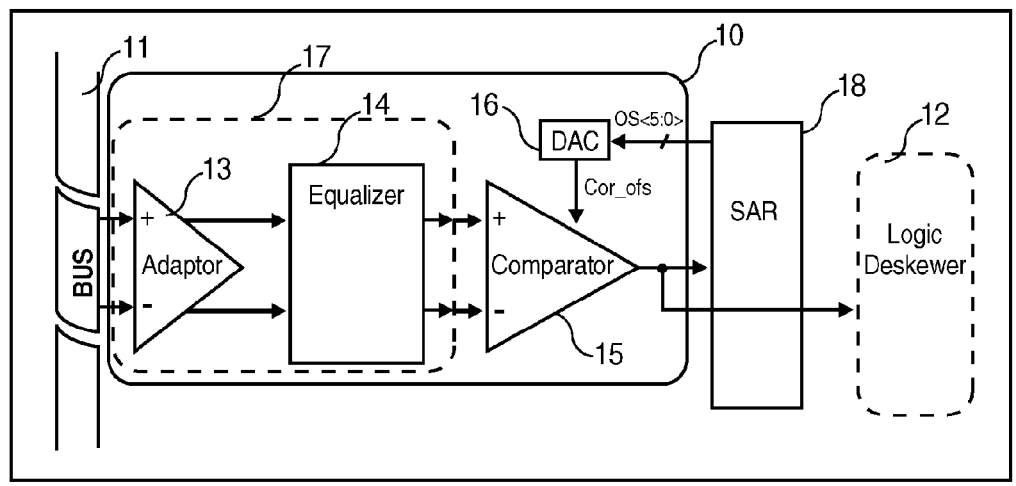
FIG. 3 is a schematic diagram of a conventional receiver of the prior art.
Figure 4:
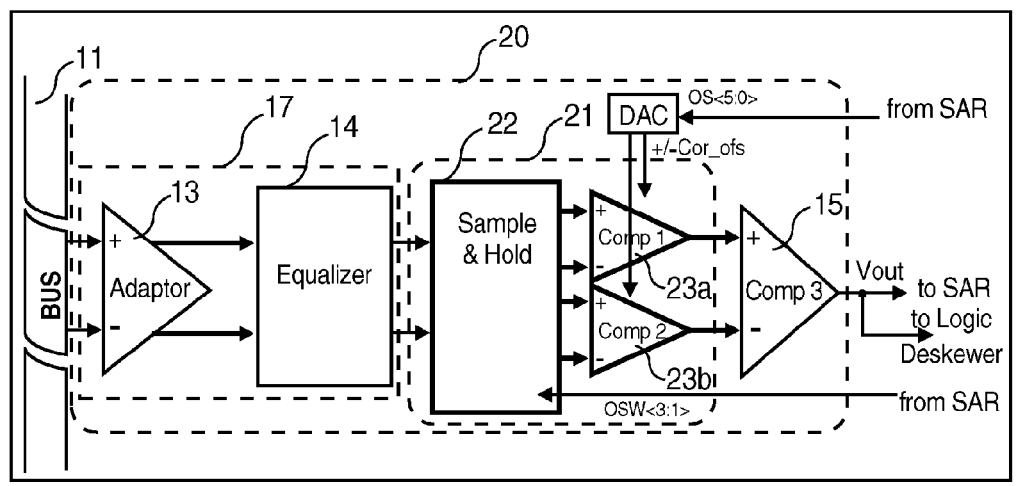
FIG. 4 is a schematic diagram of the improved receiver of the present invention.

FIG. 4 shows the schematic diagram of the improved receiver referenced 20 of the present invention placed between bus 11 (which now can be a SCSI-pi5 bus) and the logic deskewer block 12 as an interface (like reference numerals are used through the several drawings to designate identical parts). In the SCSI-pi5 application, there are up to 27 of such improved receiver 20. Now turning to FIG. 4, the improved receiver 20 differentiates of the conventional receiver 10 by the addition of block 21 between the outputs of equalizer 14 and the inputs of comparator 15. This block consists of a sample and hold circuit 22 that drives a pair of comparators 23a and 23b. The comparators 23a and 23b are respectively controlled by signal Cor_ofs and its inverted (complemented) value −Cor_ofs generated by DAC 16 (the compensation value is still determined and stored as binary digits in the SAR 18 as standard). These new elements are shown in bold lines in FIG. 4. Comparators 23a, 23b and 15 form the two successive stages of a single comparator, referred to as the global comparator. For applications other than SCSI-pi5, as mentioned above, the front end adaptor 13 can be very simple and the equalizer 14 be not used, but the new differential offset compensation technique disclosed here is still applicable.

In essence, according to the present invention, the differential offset is sampled in the improved receiver 20 and the appropriate compensation is applied to comparators 23a and 23b through the DAC 16 as standard. Associated with switches and holding capacitors of the sample and hold circuit 22 (construction details thereof will be shown in FIG. 5), the set of comparators 23a, 23b and 15 is able to compute the difference between the differential signals, asserted data and de-asserted data. The comparator 15 output then reflects the signal offset minus the offset compensation. By increasing the differential offset compensation still through the SAR/DAC/global comparator combination, the comparator 15 will flip to the other state whenever the compensation value crosses the differential offset value.

Figure 5:
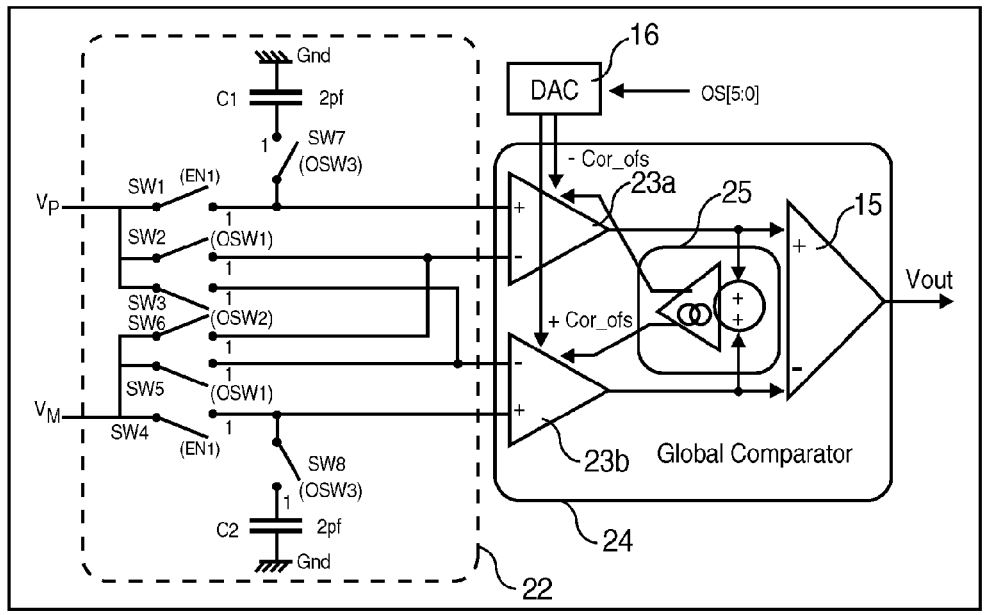
FIG. 5 shows the detailed construction of the innovative elements, i.e. the sample and hold circuit and global comparator, of the improved receiver of FIG. 4.

FIG. 5 shows construction details of the sample and hold circuit 22 to which input signals $V_P$ and $V_M$ are applied and the connections with comparators 23a and 23b at its output. Now turning to FIG. 5, let us first consider sample and hold circuit 22, eight switches SW1 to SW8 controlled by four control signals EN1, OSW1, OSW2 and OSW3 are adequately connected for a totally symmetric drive of comparators 23a and 23b. Comparators 23a and 23b operate like differential linear amplifiers because their respective gain G1 and G2 are relatively low (in the 20–30 range), unlike comparator 15 which has a gain G3 relatively high (about 1000). $V_P$ is applied to the common contact of switches SW1 (EN1), SW2 (OSW1) and SW3 (OSW2). On the other hand, $V_M$ is applied to the common contact of switches SW4 (EN1), SW5 (OSW1) and SW6 (OSW2). The switches SW7 and SW8 are connected to one electrode of holding capacitors C1 and C2 to allow them to respectively store potentials $V_P$ and $V_N$ when these potentials are applied to the positive inputs of comparators 23a and 23b. The other electrode of holding capacitors C1 and C2 is connected to the ground. The switches that are implemented in this circuit 22 are built with complementary P/N device with half-size dummy devices to minimize the clock feed-through. As far as holding capacitors are concerned, their value is sized to allow a fast charge-up but also to hold the sampled voltage during the complete compensation period taking into account the potential leakage currents and the wanted cancellation accuracy.

Still referring to FIG. 5, the respective outputs of comparators 23a and 23b are respectively applied to the positive and negative inputs of comparator 15. As mentioned above, comparators 23a, 23b and 15 operate like a global comparator which is referenced 24. Comparator 24 can then do: Vin.diff(23a)–Vin.diff(23b) in functional mode (data transfer). In order to improve the linearity of comparators 23a and 23b and balance their respective differential offsets to an average value, a conventional common mode control circuit 25 has been added for control signals +/–Cor_ofs adjustment. This is important because comparators 23a, 23b and 15 need to operate in a linear mode, since they are now the differential offset measurement unit.

The circuit shown in FIG. 5, allows comparator 15 to compute the difference between two differential signals, asserted data and de-asserted data, which is the differential offset to cancel. The sequencing of the switch commands (or controls) associated with the holding capacitors will be now described in conjunction with FIG. 6.

Figure 6:
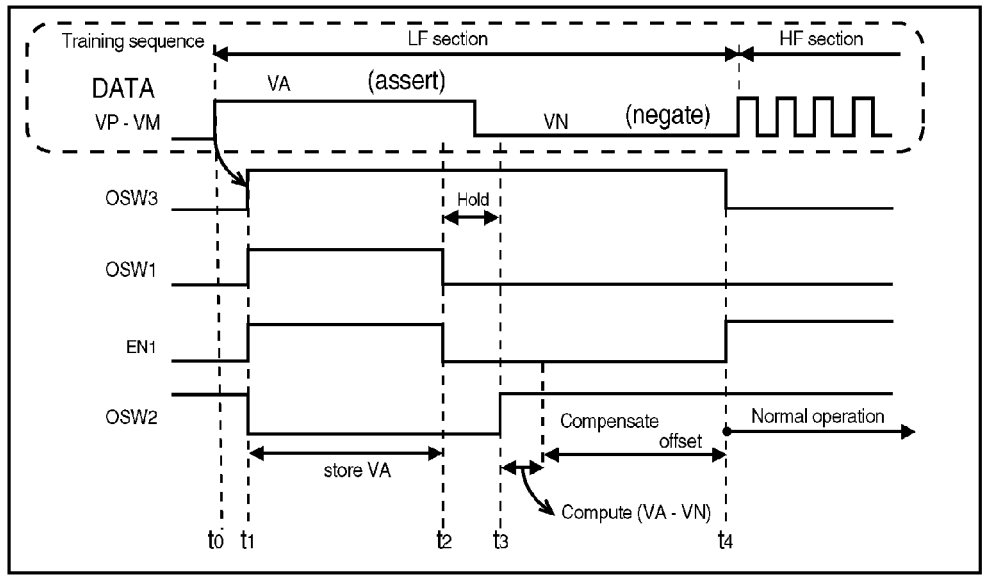
FIG. 6 is a timing diagram showing the different operating phases of the improved receiver of the present invention.

FIG. 6 shows the timing diagram of the different phases of improved receiver 20 operation which exploits the low frequency (LF) section of the SCSI-pi5 standard training sequence or pattern. Note that, the present invention could be adapted to any standard, provided that its training sequence includes a low frequency section (such a specific adaptation to other standards is within the scope of the skilled professional). Turning to FIG. 6, the trace on top of the diagram shows the SCSI-pi5 training sequence, where $V_P$ and $V_M$ still represent the differential signal applied on the positive (true) and the minus (complementary) legs or input terminals of the receiver respectively. The training pattern starts at time $t_0$ with a low frequency section (a succession of equivalents bits) that changes state in the middle. Both assert (state=1) and negate (state=0) periods are 200 ns. The assert period could be shorter, the negate period needs to be long enough to allow the successive approximation operation. Note that this compensation technique can operate if starting is performed with a negate state as well.

The switch control signals OSW1, OSW2, and OSW3 signals are generated by any logic circuit capable to detect the first toggling of the input signal that indicates the start of the training sequence. This logic circuit which must comply with the timing shown in FIG. 6 is within the scope of the skilled professional and can be integrated in the SAR block 18. The timing is defined by counting local system clock pulses. More conveniently, this can be done on the input clock signal. OSW1, OSW2, and OSW3 control signals are fed in parallel in all the improved receivers mounted in a system. On the other hand, the EN1 control signal is the logic combination of (OSW1 OR (NOT OSW3)). EN1 control signal needs to return high at the end of the cancellation to retrieve the appropriate connection for a normal data receiver function.

As apparent in FIG. 6, the whole sequencing of the receiver 20 operation can be split in four phases (please note the respective amplitudes of control signals EN1, OSW1, OSW2 and OSW3):

Phase 1: in the time interval $t_1$–$t_2$, the asserted VA voltage is sampled and stored in the holding capacitors C1 and C2;

Phase 2: in the time interval $t_2$–$t_3$, the $V_A$ value is held and the global comparator 24 is isolated from the assert to negate transition (i.e. $V_A$ to $V_N$);

Phase 3: in the time interval $t_3$–$t_4$, the differential offset $V_A$–$V_N$ is compared to the compensation value by applying the $V_N$ negate signal to allow the global comparator 24 to compute the compensation value; then, this value is increased using the value stored in SAR 18 until the differential offset is corrected.

Phase 4: at time $t_4$, the normal operation starts with the processing of the HF section of the training pattern before data are transmitted.

These four different phases will be now detailed by reference to FIGS. 7A to 7D.

Figure 7A:
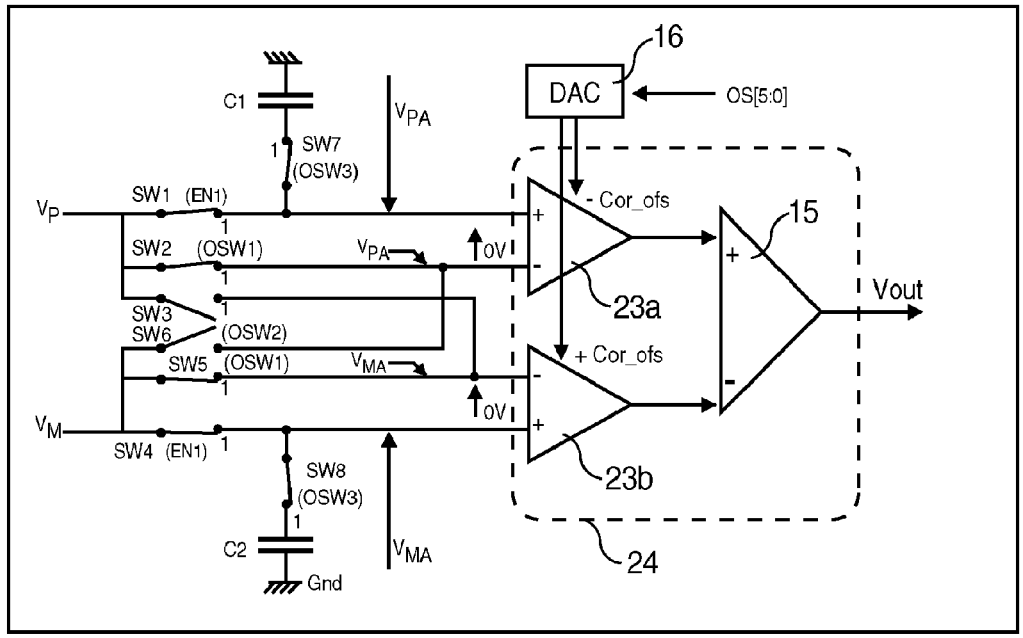
FIGS. 7A–7D show the four operating phases of the improved receiver of FIG. 4.

Phase 1 (FIG. 7A)

Switches SW 1, SW 4 (EN1) and SW7, SW8 (OSW3) are closed storing the $V_{PA}$ and $V_{MA}$ voltages in the holding capacitors C1 and C2 respectively. Switches SW 2, SW 5 (OSW1) are also closed setting comparator 23a negative input at $V_{PA}$ and comparator 23b negative input at $V_{MA}$. Consequently, the differential input at both comparators 23a and 23b is null (0 Volt). This arrangement minimizes the parasitic charge transfer in the second phase that follows due to the input capacitance of these comparators operating like differential amplifiers. It is also to be noted that the $V_{PA}$ and $V_{MA}$ signals are sampled at the positive leg of both comparators and not on the inputs of a single one. Otherwise, this single comparator would receive the full $V_{PA}-V_{MA}$ differential signal and would saturate, destroying the measurement accuracy.

Figure 7B:
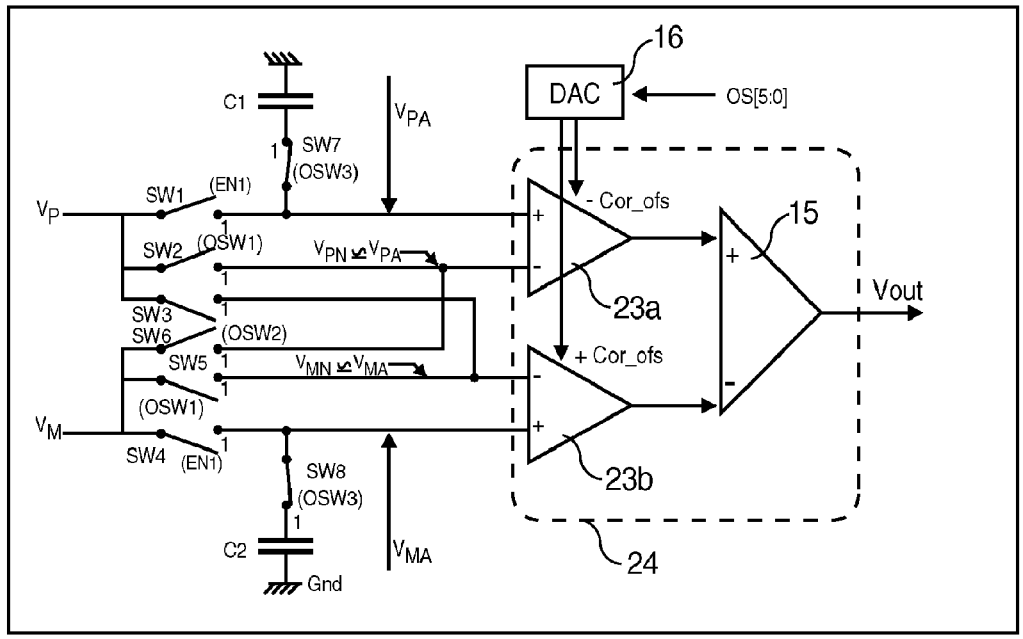

Phase 2 (FIG. 7B)

Switches SW7, SW8 (OSW3) remain closed, holding the $V_{PA}$ and $V_{MA}$ voltages in holding capacitors C1 and C2 at global comparator 24 inputs. Switches SW 1, SW 4 (EN1), SW 2, SW 5 (OSW1) and SW 3, SW 6 (OSW2) are open, isolating thereby the circuit from the Assert to Negate transition on the inputs. It is necessary to wait to have the input signal stabilized at the negate state before entering in Phase 3. Remember that during the previous phase, the negative inputs of comparators 23a and 23b are respectively loaded at $V_{PA}$ and $V_{MA}$. The next phase, will force the negative input of comparator 23a at $V_{MN}$ and the negative input of comparator 23b at $V_{PN}$. Knowing that $V_{PA}$ and $V_{MA}$ are approximately equal to $V_{MN}$ and $V_{PN}$ respectively, this once again will minimize the parasitic charge transfer in the third phase.

Figure 7C:
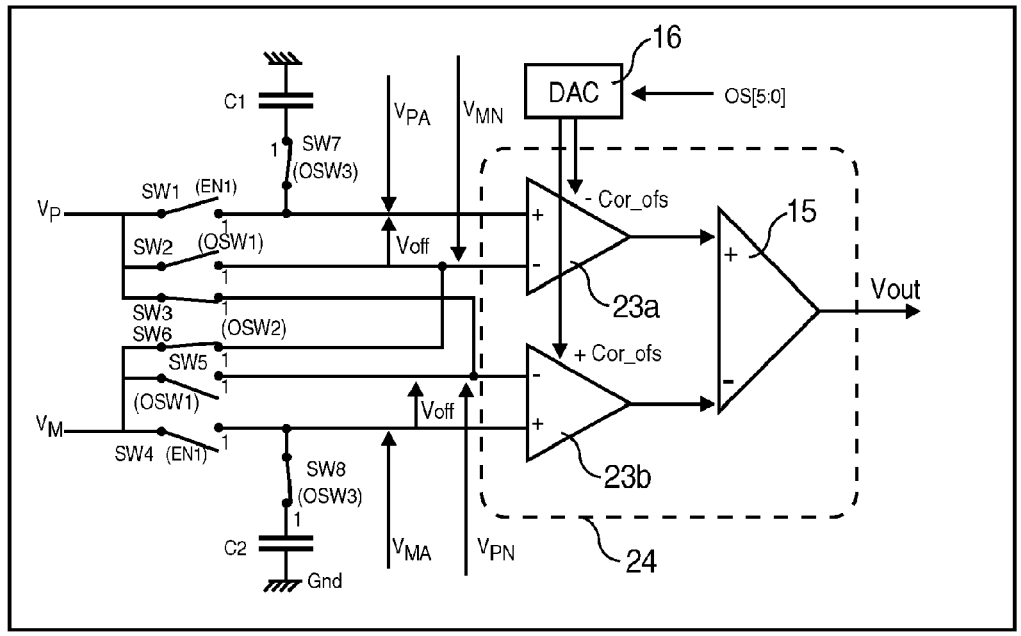

Phase 3 (FIG. 7C)

Switches SW7 and SW8 (OSW3) remain closed, holding the $V_{PA}$ and $V_{MA}$ voltages on the comparator positive input legs. Switches SW1, SW4 (EN1), SW2, SW5 (OSW1) and SW3, SW6 (OSW2) are open, but, switches SW3 and SW6 (OSW2) are closed to propagate the negate levels $V_{PN}$ and $V_{MN}$ to comparators 23a and 23b. Consequently, the voltages A1, A2 and A3 at the outputs of the respective comparators 23a, 23b and 15 are:

1 A1=G1($V_{PA}-V_{MN}$-Cor_ofs) for comparator 23a;
2 A2=G2($V_{MA}-V_{PN}$+Cor_ofs) for comparator 23b;
3 A3=G3(A1-A2)=G3(G1($V_{PA}-V_{MN}$-Cor_ofs))-(G2($V_{MA}-V_{PN}$+Cor_ofs))
4 now assuming G2 is approximately equal to G1, we have
A3=G3.G1(($V_{PA}-V_{NM}$-Cor_ofs)-($V_{MA}-V_{PN}$+Cor_ofs))
A3=G3.G1(($V_{PA}-V_{MN}$)-($V_{MA}-V_{PN}$)-2Cor_ofs)=G3.G1(2$V_{off}$-2Cor_ofs), so that A3, which is the voltage Vout at comparator 15 output, can be written as:
Vout=G($V_{off}$-Cor_ofs) wherein G=2G1G2 could be considered as global comparator 24 gain.

The global comparator 24 output then reflects the signal differential offset minus the differential offset compensation. By increasing (through the SAR 18 and DAC 16) the offset compensation, this comparator will flip to the other state whenever the compensation crosses the offset value.

The successive approximation technique described above is used to converge to the appropriate offset compensation value.

1. First, the sign of the compensation is determined. Applying a zero compensation, the global comparator 24 output state determines the offset compensation sign which is the MSB bit in the present case. The global comparator 24 output is inverted in the SAR 18 if the differential offset is negative.

2. Then, the offset magnitude is computed by successive approximations, based on the test: if the comparator 15 flips high, it means that the compensation goes over the offset value.

Taking into account comparator mismatching in terms of gain and differential offset and worst case process conditions, including $V_P$ and $V_M$ unbalanced amplitudes, the offset compensation accuracy obtained at the input of sample and hold circuit 22 by simulations was found in the 2 mV range, reducing the impact of the differential offset by ten. On the other hand, the Tasymm parameter is about 100 ps, i.e. twice better than the value requested by the SCSI-pi5 standard which is greater than 200 ps. Let us now consider, the improved receiver 20 operating in the functional mode i.e. as soon as the LF section is terminated and the HF section starts.

Figure 7D:
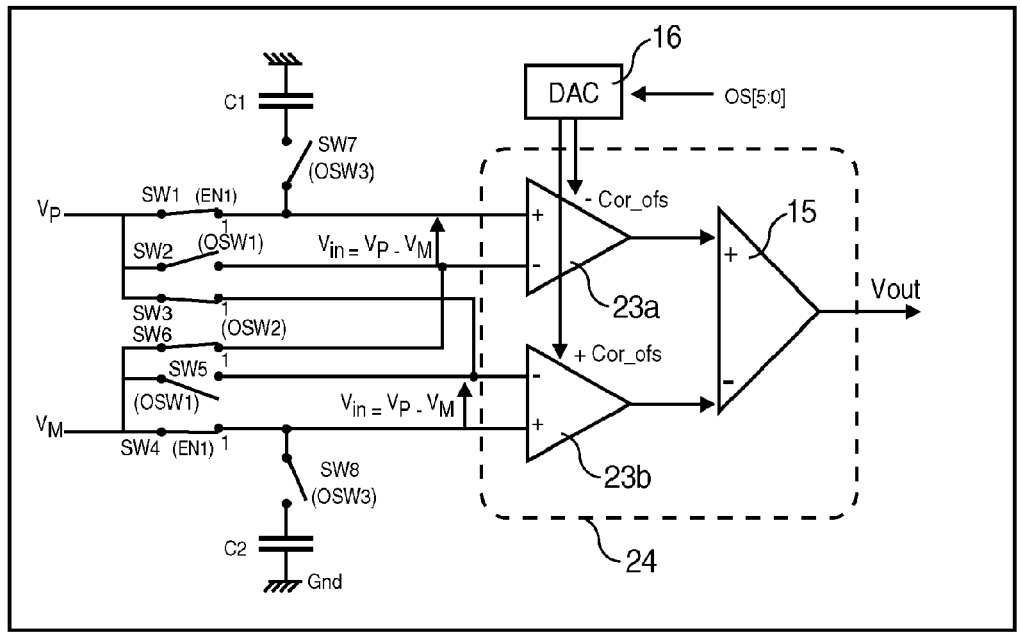

Phase 4 (FIG. 7D)

In normal operation, switches SW1, SW4 (EN1) and SW3, SW6 (OSW2) are closed, propagating $V_P$ on the positive input of comparator 23a and the negative input of comparator 23b and $V_M$ on the negative input of comparator 23a and the positive input of comparator 23b. Consequently, the voltages at the outputs at comparators 23a, 23b and 15 are given by 1 A1=G1($V_P-V_M$)
2 A2=G2($V_M-V_P$)
3 A3=G3(A1-A2)=G3(G1($V_P-V_M$)-G2($V_M-V_P$)), still assuming G1#G2, we finally obtain
4 A3=Vout=G($V_P-V_M$), which demonstrates that the combination of these three comparators 23a, 23b and 15 operate like a single comparator.

The advantages of this innovative offset compensation method are:

1 It compensates the complete signal path offset (driver, media, adaptation and receiver).

2 It is compatible to encoded and non-encoded data.

3 It is not an analog closed loop based offset compensation, so there is no stability problem.

4 Since there is no stability concern, and therefore no need to limit the measurement gain, the offset compensation could be very accurate. It is then only limited by the DAC resolution and comparator sensitivity.

5 The differential offset is measured in a differential way, which is the only solution to ignore $V_P$ and $V_M$ amplitude mismatching.

6 The offset or the gain error of the measurement unit, i.e. the global comparator, is canceled, because this comparator is also used and connected the same way, during normal data receiving operation.

7 The circuit addition in terms of complexity and size is relatively limited.

The offset compensation problem was known by the SCSI members of the T10 committee, and identified as a strong issue for operating at the SCSI-pi5 rate (320 Mbps), recommended to have an offset compensation as low as 20 mV residual offset at the bus level and a Tasymm value not greater than 200 ps, in the SCSI-pi5 T10 standard specification. The improved receiver of the present invention has demonstrated a residual offset of about 10 mV on the bus 11 (attenuated by a factor of 5 in analog amplifier 17 so that the value of 2 mV is measured at the input of the global comparator as mentioned above and Tasymm parameter in the 100 ps range only. This present invention thus provides an offset compensation which is twice better than the requested specification.

While the invention has been particularly described with respect to a preferred embodiment thereof it should be understood by one skilled in the art that the foregoing and other changes in form and details may be made therein without departing from the spirit and scope of the invention.

What is claimed is:

1. An improved receiver (20) connected to a driver via a bus (11) transporting an input differential signal ($V_P-V_M$) represented by two states consisting of at least a low frequency section including a training pattern during a preliminary phase comprising:

a sample and hold differential circuit (22) made of switches and two holding capacitors to which said input differential signal is applied to generate first and second differential signals, so that the first differential signal holds a first state and the second differential signal propagates the second state;

first and second differential comparators (23a, 23b), each having positive and negative inputs and a single output, that driven by said first and second differential signals and are configured to receive first and second offset compensation signals respectively;

a third differential comparator (15) having positive and negative inputs and a single outPut that is driven by the respective output of said first and second comparators where the output signal (Vout) represents the differential offset minus the offset compensation;

a successive approximation register (SAR) configured to receive said output signal which performs successive iterations to compute the offset compensation value, to digitize and store this value;

a DAC (16) which applies this binary value converted in a first offset compensation signal and its complemented value (+/−Cor ofs) that are applied to said first and second comparators respectively for offset compensation; and, synchronization means (EN, OSW) for adequately activating said switches for sampling and memorizing the input differential signal in said holding capacitors further comprising a common mode control circuit (25) connected between its positive and negative inputs to said first and second comparators to generate a control signal and its inverted value that are applied to said first and second comparators respectively to improve their linearity for better accuracy.

2. The improved receiver of claim 1 wherein said input differential signal to be processed include encoded and/or non-encoded data so that it is totally adapted to meet SCSI-pi5 specification.

3. The improved receiver of claim 1 wherein said sample and hold circuit is configured to minimize the parasitic charge transfer due to the input capacitance of these comparators.

4. The improved receiver of claim 1 further comprising an analog input differential amplifier (17) connected between said bus and the positive and negative inputs of said sample and hold differential circuit.

5. The improved receiver of claim 4 wherein said input differential amplifier consists of an adaptor (13) and an equalizer (14) that are connected in series.

6. The improved receiver of claim 1 wherein the gain of said first and second comparators is about 20 and the gain of said third comparator is about 1000.

7. A method for compensating the full signal path differential offset between a driver and a receiver via a bus, wherein the input differential signal includes at least a low frequency section transporting a training comprising the steps of:

sampling the input differential signal in a sample and hold differential circuit made of switches and two holding capacitors to generate first and second differential signals, so that the first differential signal holds a first state and the second differential signal propagates the second state;

applying said first and second differential signals to first and second comparators to compute the difference between these states;

applying the signals that are output by said first and second comparators to the positive and negative inputs of a third comparator to make the difference therebetween and generates an output voltage that reflects the differential offset minus the compensation offset;

determining the binary value of said compensation offset by successive iterations in a successive approximation register, digitizing said compensation value and storing it therein;

applying said binary compensation value in a DAC to generate a first offset compensation signal and its complemented value;

applying said offset compensation signal and its complement value to said first and second comparators for offset compensation;

generating a control signal and its inverted value; and, applying said control signal and its inverted value to said first and second comparators for accuracy improvement.

8. The method for compensating the full signal path differential offset of claim 7 wherein said input differential signal includes encoded and/or non-encoded data so that it is totally adapted to meet SCSI-pi5 specification.

* * * * *